United States Patent [19]

Pumo

[11] Patent Number: 4,616,147
[45] Date of Patent: Oct. 7, 1986

[54] PROGRAMMABLE EDGE DEFINED OUTPUT BUFFER

[75] Inventor: Joseph Pumo, Austin, Tex.

[73] Assignee: Motorola, Inc., Schaumburg, Ill.

[21] Appl. No.: 672,538

[22] Filed: Nov. 15, 1984

[51] Int. Cl.[4] .......................................... H03K 17/693
[52] U.S. Cl. .................... 307/481; 307/450; 307/453; 307/468; 307/269
[58] Field of Search ............... 307/443, 480, 453, 465, 307/468, 480, 481, 244, 582–584, 269; 364/716

[56] References Cited

U.S. PATENT DOCUMENTS

| | | | |
|---|---|---|---|
| 4,084,105 | 4/1978 | Teranishi et al. | 307/468 X |
| 4,204,131 | 5/1980 | Dozier | 307/244 X |
| 4,469,964 | 9/1984 | Guttag et al. | 307/481 |
| 4,482,822 | 11/1984 | Kamuro et al. | 307/468 |
| 4,525,640 | 6/1985 | Boyle et al. | 307/450 |
| 4,568,841 | 2/1986 | Mayhew | 307/269 X |

OTHER PUBLICATIONS

Rutherford, "Time Division Multiplex Modulator for Multiphase Dynamic FET Logic", *IBM T.D.B.*, vol. 14, No. 7, 12-1971, p. 1982.
Cordaro et al, "Programmable On-Chip Clock Generator", *IBM T.D.B.*, vol. 17, No. 4, Sep. 1974, pp. 1051–1052.

*Primary Examiner*—Larry N. Anagnos
*Assistant Examiner*—D. R. Hudspeth
*Attorney, Agent, or Firm*—Anthony J. Sarli, Jr.; Jeffrey Van Myers; James L. Clingan, Jr.

[57] ABSTRACT

A programmable edge defined output buffer clocks a first logic state to a first node when an input signal is in a first condition and a second logic state to a second node when the input signal is in a second condition. A programmable coupling circuit is programmable to couple the first and second nodes to an input of an amplifier. The programming selection determines in response to which signals will the first and second nodes be coupled to the input of the amplifier.

14 Claims, 2 Drawing Figures

| VI | PROGRAMMED | VO | CLOCKED BY |
|---|---|---|---|
| HIGH | 12 | LOW | PH1 |
| HIGH | 13 | LOW | PH1 AND CA |
| HIGH | 13 AND 14 | LOW | PH1 AND (CA OR CB) |
| HIGH | 14 | LOW | PH1 AND CB |
| LOW | 17 | HIGH | PH1 |
| LOW | 16 | HIGH | PH1 AND CA |
| LOW | 16 AND 15 | HIGH | PH1 AND (CA OR CB) |
| LOW | 15 | HIGH | PH1 AND CB |

4,616,147

PROGRAMMABLE EDGE DEFINED OUTPUT BUFFER

FIELD OF THE INVENTION

The subject invention relates to synchronization circuits, and more particularly, to programmable edge defined output buffer circuits.

BACKGROUND OF THE INVENTION

In synchronizing signal outputs, it has been found desirable to clock different logic states on different clocks. A certain signal may be a logic high or a logic low, but is to be received only at certain predetermined times. When that predetermined time is may actually depend on what the logic state of the signal is. For example, it may be desirable to receive the signal on a first clock if the signal is a logic high, but on a second signal if the signal is a logic low. U.S. Pat. No. 4,379,241, Pumo, teaches an edge defined output buffer for achieving this result. In designing a large scale integrated circuit, there may be numerous such situations in which signals are to be clocked but at different times depending on the logic state. Some such signals may have the logic high clocked on a first clock, and the logic low on a second clock. Whereas, other such signals would have the low clocked on the first clock, and the logic high clocked on the second clock. Furthermore, in the course of design, changes may be made as to when such logic states are clocked. These changes may in fact occur relatively late in the design. Such changes can cause costly delays, particularly in laying out the integrated circuit.

SUMMARY OF THE INVENTION

An object of the present invention is to provide an improved edge defined output buffer.

Another object of the invention is to provide an edge defined output buffer with improved flexibility.

Yet another object of the invention is to provide an edge defined output buffer with programmable edge selectivity.

These and other objects of the invention are achieved in a programmable output buffer. A first coupling circuit couples a first logic state to a first node when a first signal is in a first condition. A second coupling circuit couples a second logic state to a second node when the first signal is in a second condition. An output amplifier has an input and an output. A first programming terminal is capable of being programmed to be coupled to the input of the amplifier. A second programming terminal is capable of being programmed to be coupled to the input of the amplifier. A third coupling circuit couples the first logic state from the first node to the first programming terminal in response to a first clock signal. A fourth coupling means couples the second logic state from the second node to the second programming terminal in response to a second clock signal.

DESCRIPTION OF THE INVENTION

Figures 1, 2:
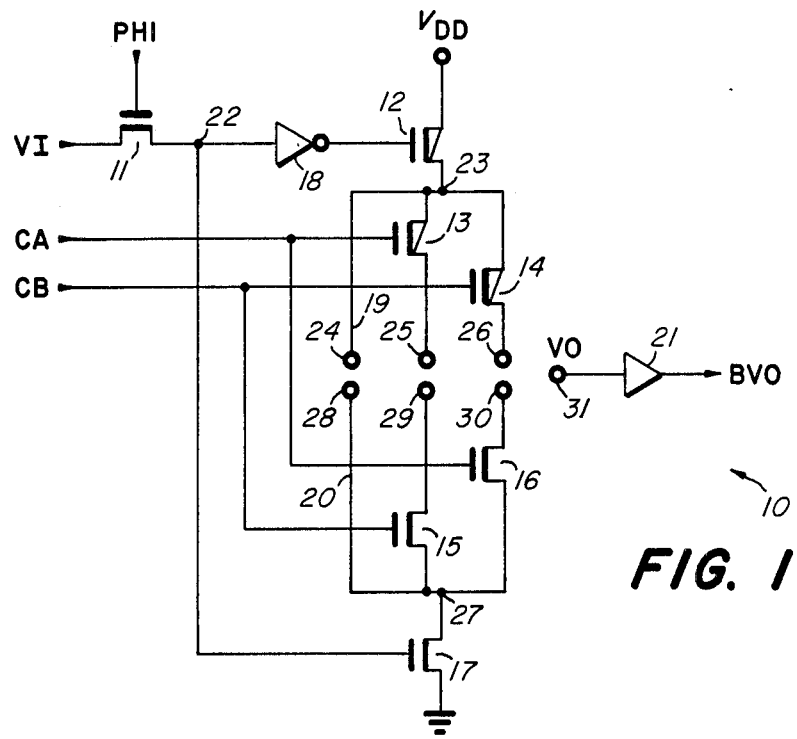
FIG. 1 is a circuit diagram of a programmable edge defined output buffer according to a preferred embodiment of the invention.
FIG. 2 is a table showing the programming permutations of the programmable buffer of FIG. 1.

Shown in FIG. 1 is a programmable edge defined output buffer 10 comprised of a transistor 11, a transistor 12, a transistor 13, a transistor 14, a transistor 15, a transistor 16, a transistor 17, an inverter 18, a programmable connecting line 19, a programmable connecting line 20, and an amplifier 21. Transistors 11–17 are N channel insulated gate field effect transistors (IGFETs). Transistors 12–14 are natural transistors having a threshold voltage very near zero volts. Transistors 11 and 15–17 are enhancement mode transistors having a threshold voltage between 0.6 and 0.8 volt.

Transistor 11 has a control electrode for receiving a clock signal PH1, a first current electrode for receiving an input signal VI, and a second current electrode connected to a node 22. Transistor 11 takes advantage of the bilateral nature of IGFETs by having the first and second current electrodes each vary between functioning as a source or drain. Inverter 18 has an input connected to node 22, and an output. Transistor 12 has a control electrode connected to the output of inverter 18, a drain connected to a positive power supply terminal for receiving, for example, 5 volts, and a source connected to a node 23. Programmable connecting line 19 is a conductor, such as polysilicon or aluminum, connected between node 23 and a programming terminal 24. Transistor 13 has a drain connected to node 23, a gate for receiving a clock signal CA, and a source connected to a programming terminal 25. Transistor 14 has a drain connected to node 23, a gate for receiving a clock signal CB, and a source connected to a programming terminal 26. Programmable connecting line 20 is a conductor, such as polysilicon or aluminum, connected between a node 27 and a programming terminal 28. Transistor 15 has a gate for receiving signal CB, a drain connected to a programming terminal 29, and a source connected to a node 27. Transistor 16 has a drain connected to a programming terminal 30, a gate for receiving signal CA, and a source connected to node 27. Transistor 17 has a drain connected to node 27, a gate connected to node 22, and a source connected to ground. Amplifier 21, has an input connected to a programming terminal 31 for receiving an output signal VO, and an output for providing a buffered output signal BVO.

When the condition of clock signal PH1 is a logic high, signal VI is coupled to node 22. When node 22 is a logic high, transistor 17 is conducting, causing node 27 to be a logic low, and inverter 18 provides a logic low to transistor 12 causing transistor 12 to be non-conducting. Transistor 12 in such case does not effect the logic state at node 23. When node 22 is a logic low, inverter 18 provides a logic high to transistor 12 causing transistor 12 to provide a logic high at node 23, and transistor 17 is not conducting so that the logic state at node 27 is not effected by transistor 17. Signal PH1 at a logic high is considered a PH1 time. Consequently, during PH1 time, if the condition of signal VI is a logic high, node 27 is a logic low, and node 23 is unaffected. During a PH1 time in which the condition of signal VI is a logic low, node 23 is a logic high, and node 27 is unaffected. Programming terminals 24–26 and 28–30 are selectively connected to terminal 31 to determine when signal VO becomes the inverse of the logic state of signal VI. Terminals 24–26 are used for selecting when signal VO will become a logic high in the cases in which node 23 is a logic high. Terminals 28–30 are used for selecting when signal VO will become a logic low in the cases in which node 27 is a logic low.

For the case in which node 23 is a logic high, connecting programming terminal 24 to programming terminal 31 will cause signal VO to be a logic high in response to signal PH1 switching to a logic high. Connecting programming terminal 25 to programming terminal 31 will result in signal VO becoming a logic high when signal CA switches to a logic high. Connecting programming terminal 26 to programming terminal 31 will result in signal VO becoming a logic high when signal CB switches to a logic high. Both programming terminals 25 and 26 can be connected to programming terminal 31 to result in signal VO becoming a logic high when either signal CA or CB switches to a logic high.

For the case in which node 27 is a logic low, connecting programming terminal 28 to programming terminal 31 results in signal VO becoming a logic low when signal PH1 becomes a logic low. Connecting programming terminal 29 to programming terminal 31 results in signal VO becoming a logic low when signal CB switches to a logic low. Connecting programming terminal 30 to programming terminal 31 results in signal VO becoming a logic low when signal CA switches to a logic low. Both programming terminals 29 and 30 can be connected to programming terminal 31 to result in signal VO becoming a logic low when either signal CA or signal CB switches to a logic high.

Terminals 24-26 and 28-30 can be programmed to be connected to terminal 31 by any conventional technique. Such techniques include using polysilicon metal to connect selected transistor output of transistors 12, 13, 14, 15, 16, and 17 to the input of amplifier 21. Another technique is to have the drains of selected transistors 15-17 formed in a common region of the substrate with sources of selected transistors 12-14. Such common region is then connected by metal or polysilicon to the input of amplifier 31. Unselected sources and drains would remain distinct regions. Field oxide would separate regions not selected to be in the common region. Furthermore, any of unselected transistors 13-16 need not even be formed.

Thus it is shown that an input signal, signal VI, can be clocked on various clock edges. Signal VI is clocked in inverted form as signal VO and further buffered by amplifier 21 to become signal BVO. Logic low signal VI is clocked to the input of amplifier 21 as a logic high by signal PH1 being a logic high when the source of transistor 12 is programmed to be connected to the input of amplifier 21; by signal PH1 being a logic high and signal CA being a logic high when the source of transistor 13 is programmed to be connected to the input of amplifier 21; by signal PH1 and signal CB being a logic high when the source of transistor 14 is programmed to be connected to the input of amplifier 21; and by signal PH1 and either signal CA or signal CB when the sources of transistors 13 and 14 are programmed to be connected to the input of amplifier 21. Logic high signal VI is clocked to the input of amplifier 21 by signal PH1 being a logic high when the drain of transistor 17 is programmed to be connected to the input of amplifier 21; by signal PH1 and signal CA being a logic high when the drain of transistor 16 is programmed to be connected to the input of amplifier 21; by signal PH1 and signal CB when the drain of transistor 15 is programmed to be connected to the input of amplifier 21; and by signal PH1 and either signal CA or signal CB when the drains of transistors 15 and 16 are programmed to be connected to the input of amplifier 21. These programming permutations are shown in a table in FIG. 2.

For the embodiment shown in FIG. 1, signal PH1 is of sufficiently high frequency that capacitance of node 22 is sufficient to maintain the logic state thereat when signal PH1 is a logic low. The logic state of node 22 can change only when signal PH1 is a logic high. If necessary, node 22 could be latched. This could be achieved by a conventional retainer circuit. One way would be to have a small inverter with an input connected to the output of inverter 18, and an output connected to node 22. Because node 22 retains its logic state while signal PH1 is a logic low, signal VO can change state after signal PH1 switches to a logic low. Because node 22 can only change state when signal PH1 is a logic high, signal PH1 is still required to be a logic high to effect a logic state change on signal VIO although the actual logic state change of signal VO may occur after the following logic low of signal PH1.

I claim:

1. A programmable output buffer, comprising:
   first means for coupling a first logic state to a first node when a first signal is in a first condition;
   second means for coupling a second logic state to a second node when the first signal is in a second condition;
   an output amplifier having an input, and an output;
   a first programming terminal capable of being programmed to be coupled to the input of the amplifier;
   a second programming terminal capable of being programmed to be coupled to the input of the amplifier;
   third means for coupling the first logic state from the first node to the first programming terminal in response to a first clock signal; and
   fourth means for coupling the second logic state from the second node to the second programming terminal in response to a second clock signal;
   whereby the output buffer is programmed by connecting selected ones of the first node, second node, first programming terminal, and second programming terminal to the input of the output amplifier.

2. The programmable buffer of claim 1 further comprising:
   a third programming terminal capable of being programmed to be coupled to the input of the amplifier; and
   fifth means for coupling the first logic state from the first node to the first programming terminal in response to the second clock signal.

3. The programmable buffer of claim 2 further comprising:
   a fourth programming terminal capable of being programmed to be coupled to input of the amplifier; and
   a sixth means for coupling the second logic state from the second node to the fourth programming terminal in response to the first clock signal.

4. The programmable buffer of claim 3 wherein the first node is characterized as programmable to be coupled to the input of the amplifier.

5. The programmable buffer of claim 4, wherein the second node is characterized as programmable to be coupled to the input of the amplifier.

6. A programmable buffer comprising:

an amplifier having an input and an output;

a first transistor having a control electrode for receiving a first clock signal, a first current electrode for receiving an input signal, and a second current electrode;

an inverter having an input coupled to the second current electrode of the first transistor, and an output;

a second transistor having a control electrode coupled to the output of the inverter, a first current electrode coupled to a first power supply terminal; and a second current electrode programmable to be connected to the input of the amplifier;

a third transistor having a first current electrode connected to the second current electrode of the second transistor, a control electrode for receiving a second clock signal, and a second current electrode programmable to be connected to the input of the amplifier;

a fourth transistor having a control electrode coupled to the second current electrode of the first transistor, a first current electrode coupled to a second power supply terminal, and a second current electrode programmable to be connected to the input of the amplifier; and a fifth transistor having a first current electrode coupled to the second current electrode of the fourth transistor, a second current electrode programmable to be connected to the input of the amplifier, and a control electrode for receiving a third clock signal.

7. The programmable buffer of claim 6 further comprising: a sixth transistor having a first current electrode coupled to the second current electrode of the second transistor, a control electrode for receiving the third clock signal, and a second current electrode programmable to be coupled to the input of the amplifier.

8. The programmable buffer of claim 7 further comprising: a seventh transistor having a first current electrode coupled to the second current electrode of the fourth transistor, a control electrode for receiving the second clock signal, and a second current electrode programmable to be coupled to the input of the amplifier.

9. The programmable buffer of claim 8 wherein the second, third, and sixth transistors are natural transistors.

10. The programmable buffer of claim 6 wherein the second transistor is a natural transistor.

11. The programmable buffer of claim 10 wherein the third transistor is a natural transistor.

12. A programmable buffer comprising:

an amplifier having an input and an output;

a first transistor having a control electrode for receiving a first clock signal, a first current electrode for receiving an input signal, and a second current electrode;

an inverter having an input coupled to the second current electrode of the first transistor, and an output;

a second transistor having a control electrode coupled to the output of the inverter, a first current electrode coupled to a first power supply terminal; and a second current electrode programmable to be connected to the input of the amplifier;

a third transistor having a first current electrode connected to the second current electrode of the second transistor, a control electrode for receiving a second clock signal, and a second current electrode programmable to be connected to the input of the amplifier;

a fourth transistor having a control electrode coupled to the second current electrode of the first transistor, a first current electrode coupled to a second power supply terminal, and a second current electrode programmable to be connected to the input of the amplifier; and a fifth transistor having a first current electrode coupled to the second current electrode of the fourth transistor, a second current electrode programmable to be connected to the input of the amplifier, and a control electrode for receiving the second clock signal.

13. The programmable buffer of claim 12 wherein the second transistor is a natural transistor.

14. The programmable buffer of claim 13 wherein the third transistor is a natural transistor.

* * * * *